United States Patent [19]

Goto et al.

[11] Patent Number: 5,068,123

[45] Date of Patent: Nov. 26, 1991

[54] PROCESS FOR PRODUCING RECORDING MEDIUM AND APPARATUS THEREFOR

[75] Inventors: Hiroshi Goto, Yokohama; Toshiaki Harada, Kawasaki; Noriyoshi Ishikawa, Yokohama, all of Japan

[73] Assignee: Canon Kabushiki Kaisha, Tokyo, Japan

[21] Appl. No.: 399,240

[22] Filed: Aug. 29, 1989

[30] Foreign Application Priority Data

| Aug. 30, 1988 | [JP] | Japan | 63-213686 |
| Nov. 11, 1988 | [JP] | Japan | 63-283834 |
| Dec. 6, 1988 | [JP] | Japan | 63-306838 |

[51] Int. Cl.$^5$ .......................... B05D 1/40; B05D 3/02; B05D 3/12
[52] U.S. Cl. ...................................... 427/32; 427/146; 427/152; 427/202; 427/346; 427/348; 427/350; 430/138
[58] Field of Search .................. 430/138; 427/57, 202, 427/32, 150, 153, 346, 348, 152, 350, 146; 118/57

[56] References Cited

U.S. PATENT DOCUMENTS

| 2,603,575 | 7/1952 | Schramm, Jr. | 427/195 X |
| 2,740,725 | 4/1956 | Ball | 118/57 X |
| 4,847,110 | 7/1989 | Nakajima et al. | 427/202 X |

*Primary Examiner*—Evan Lawrence
*Attorney, Agent, or Firm*—Fitzpatrick, Cella, Harper & Scinto

[57] ABSTRACT

A process for producing a recording medium comprising a substrate and a plurality of image forming elements disposed thereon, which comprises the steps of: applying a binder onto the substrate to form thereon a binder layer; disposing the image forming elements on the binder layer; and simultaneously applying a vibration and a pressure to the image forming elements disposed on the binder layer sufficient to bond the image forming elements to the substrate as a substantially monoparticle layer.

12 Claims, 7 Drawing Sheets

PROCESS FOR PRODUCING RECORDING MEDIUM AND APPARATUS THEREFOR

FIELD OF THE INVENTION AND RELATED ARTS

The present invention relates to a process for producing a recording medium comprising a substrate and a plurality of image forming elements, and an apparatus for producing the same.

In recent years, various recording methods and apparatus adapted for various information processing systems have been developed. Among these, the thermal transfer recording method has advantages that the apparatus employed is light in weight, compact, free of noise, excellent in operability and adapted to easy maintenance, and accordingly has been recently widely used. According to this method, plain paper may be used as a transfer-receiving medium.

Further, there has been proposed a method of forming a visible multi-color image by use of a chromogenic material, and a developer. For example, U.S. Pat. No. 4,399,209 discloses an image forming system using a recording medium comprising a substrate and microcapsules disposed thereon containing a photosensitive composition and a chromogenic material. In this system, the recording medium is exposed mainly to ultraviolet rays exchanged corresponding to an image to be recorded to cure or harden the photosensitive composition thereby to form a latent image, which is then caused to contact a transfer-receiving medium having a developer layer, and the resultant super-position is passed through a nip between a pair of pressure rollers to rupture the microcapsules, whereby the latent image is developed.

Further, U.S. Pat. No. 4,416,966 discloses a "self-contained" image forming system wherein an image-forming sheet comprising photosensitive microcapsules and a developer both disposed on the same surface of a substrate is used. In this system, the image-forming sheet is exposed mainly to ultraviolet rays exchanged corresponding to an image to be recorded, and then it is passed through pressing rollers so that the microcapsules are ruptured and the internal phase thereof is ejected imagewise. Concurrently, a chromogenic material migrates to the developer ordinarily disposed in another layer and the chromogenic material reacts therewith to form a multi-color image.

In both of the above-mentioned recording systems, a photo-initiator having different sensitive wavelength regions is contained in microcapsules, and they are exposed mainly to ultraviolet rays exchanged corresponding to the respective sensitive wavelength regions to cure the content of the microcapsules.

In each of the above-mentioned recording methods, however, only light energy (mainly of ultraviolet rays) is used for forming a latent image on a recording medium comprising a substrate and microcapsules disposed thereon, so that a recording medium highly sensitive to light, or a light flux of a high energy is required in order to obtain a clear image at a high speed. A high sensitivity recording medium only utilizing light energy is also sensitive under no application of light, and therefore it has poor storage stability in the neighborhood of room temperature.

Further, in the above-mentioned method, since only light energy is used for forming a latent image on a recording medium, it is not suitable in a case where an image is outputted depending on an external signal in an apparatus such as a printer, or in a case where image information read from a multi-color original is converted into a digital signal by using a color-image scanner and then imparted to a recording medium. More specifically, a light flux having a shorter wavelength, mainly of ultraviolet rays, is required in order to radiate a light of high energy, but there has not been obtained a light source which can digitally control ultraviolet rays. For example, an optical head such as a liquid crystal shutter array and an LED array has been proposed in order to obtain a digital light source. However, although these heads are suitable for miniaturization, ultraviolet rays cannot stably be obtained thereby because liquid crystal molecules deteriorate in an ultraviolet wavelength region.

Further, in the above-mentioned recording method, the enclosed material in the microcapsules is required to be formed as a photosensitive composition which is liquid at room temperature, and therefore provides a poor storage stability. Moreover, the resultant image is accompanied with the odor of a residual monomer because a non-reacted material is ruptured, thus providing a practically undesirable characteristic.

In order to solve the above-mentioned problems, our research group has proposed a novel image forming method and a recording medium suitably used therefor (U.S. Pat. No. 5,015,552).

The above-mentioned recording medium comprises a substrate and image forming elements disposed thereon which are capable of changing their transfer characteristic when provided with plural kinds of energies including light energy under such a condition that at least one of the plural kinds of energies corresponds to a recording information signal. In the above-mentioned image forming method, e.g., light and heat energies are imparted to a transfer recording layer under such a condition that at least one of the light and heat energies corresponds to a recording information signal to form a portion having a transfer characteristic which is different from another portion in the transfer recording layer, whereby a transferable image based on such a difference in a physical property is formed, and the transferable image is transferred to a transfer-receiving medium (or a medium to be recorded) by utilizing the above-mentioned difference in physical property.

For example, with respect to a recording medium used in a transfer mode wherein transfer of an image is effected through heat-fusion of the image, the above-mentioned physical property may be a melting temperature, a softening temperature, a glass transition temperature, etc. With respect to a recording medium used in a transfer mode wherein transfer of image is effected by making an image to be transferred viscous or penetrable into a transfer-receiving medium, the physical property may be a viscosity at the relevant temperature.

Figure 14:
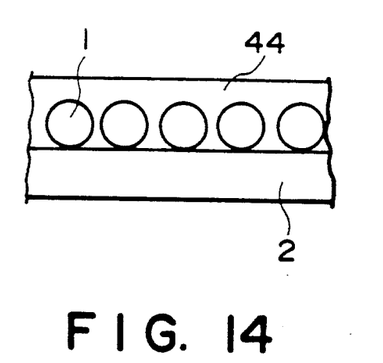
FIGS. 14 and 15 are schematic sectional views each showing a recording medium produced according to the conventional production process.
Figure 15:
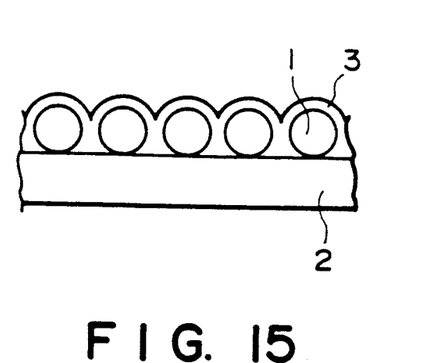

Conventionally, a recording medium comprising a substrate and image forming elements such as microcapsules disposed thereon has been produced as shown in FIGS. 14 and 15. More specifically, a desired amount of image forming elements 1 are dispersed in a coating liquid 44 therefor (ordinarily comprising a volatile solvent and a binder material) to obtain a mixture liquid containing the image forming elements, which is then applied onto a substrate 2 so as to provide a desired thickness (as shown in FIG. 14), and thereafter the volatile solvent contained in the coating liquid 44 is volatilized to solidify or harden the binder, whereby the image forming elements 1 are bonded to the substrate 2, as shown in FIG. 15.

However, in such a method using a mixture liquid containing image forming elements dispersed therein, it is difficult to control the movement of the image forming elements contained in the liquid. Accordingly, even if the thickness of a layer of the mixture liquid is strictly regulated at the time of the above-mentioned application of the mixture liquid, it is not easy to uniformly dispose the image forming elements on the substrate so as to provide a monoparticle layer.

Figure 16:
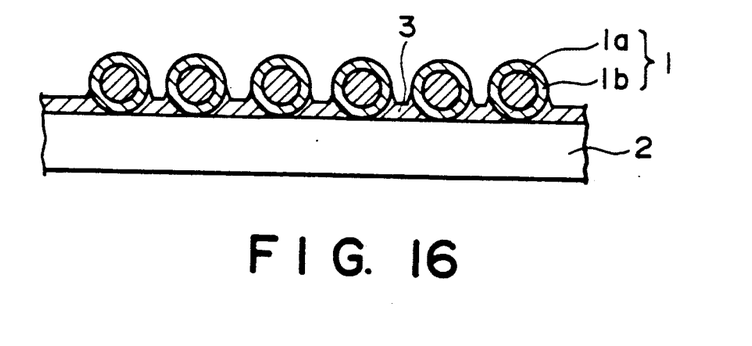
FIG. 16 is a schematic sectional view showing a recording medium produced according to the production process which has previously been proposed by our research group.

In a recording medium as shown in FIG. 16 wherein microcapsules 1 are disposed on a substrate 2, in order to sufficiently eject the core material 1a of the microcapsule 1 without hindrance due to a binder 3 at the time of the rupture of the wall material 1b, it is preferred that the periphery of each microcapsule 1 is not completely covered with the binder 3 and a part of each microcapsule 1 protrudes from the binder 3. Further, in order to obtain a recorded image having a high image density and a faithfully reproduced color on the basis of sufficient transfer, it is further preferred that the microcapsules 1 are bonded to the substrate 2 uniformly and densely so as to provide a mono-particle layer.

However, when the conventional production process as shown in FIGS. 14 and 15 is used, it is difficult to obtain a recording medium wherein a part of the surface of the image forming element is caused to protrude from a binder.

Our research group has proposed a process for producing a recording medium wherein image forming elements are not completely covered with a binder and they are uniformly bonded to a substrate so as to form a mono-particle layer (U.S. Pat. No. 4,847,110).

According to this process, a recording medium may be produced in the following manner.

First, a layer of a binder is formed on a substrate, and an excess of image forming elements are distributed on the binder layer. At this time, the image forming elements are disposed on the substrate so as to form a multi-particle layer. Then, image forming elements not sufficiently contacting the binder are removed thereby to obtain a recording medium wherein image forming elements are disposed on the substrate so as to form a mono-particle layer.

In the above-mentioned U.S. patent application of our research group, in order to dispose the image forming elements 1 on the binder 3, there has been proposed, in addition to the simple distribution method, a method wherein a separately provided substrate having thereon a distributed image forming elements is superposed on a substrate having thereon a layer of a binder 3; or a method wherein a substrate having an coating layer of a binder 3 thereon is moved while contacting the upper portion of an container containing image forming elements 1, etc.

Further, in the above-mentioned patent application of our research group, in order to remove image forming element not sufficiently contacting the binder disposed on the substrate, there has been proposed a method wherein the image forming elements are dropped due to gravity; a method wherein the image forming elements are removed by attaching them to an adhesion member; a method wherein the image forming elements are removed by supplying a gas stream thereto; etc.

However, the above-mentioned method is not necessarily satisfactory in some cases. Particularly, in view of denser or closer arrangement of image forming elements, there is still room for improvement.

SUMMARY OF THE INVENTION

An object of the present invention is to further improve the above-mentioned production process of our research group.

Another object of the present invention is to provide a process and an apparatus for producing a recording medium wherein a plurality of image forming elements are disposed on a substrate uniformly and densely (or closely) so as to form a substantially mono-particle layer, at a high speed in a good yield.

According to the present invention, there is provided a process for producing a recording medium comprising a substrate and a plurality of image forming elements disposed thereon, which comprises the steps of:

applying a binder onto the substrate to form thereon a binder layer;

disposing the image forming elements on the binder layer; and applying a vibration and a pressure to the image forming elements disposed on the binder layer.

The present invention also provides an apparatus for producing a recording medium comprising a substrate and a plurality of image forming elements disposed thereon, which comprises:

a feed roller for feeding the substrate;

a container for applying a binder onto the substrate to form thereon a binder layer;

a feeder for disposing the image forming elements on the binder layer, a roller for applying a vibration and a pressure to the image forming elements disposed on the binder layer, the roller being disposed so as to traverse the substrate; and a winding roller for winding the substrate carrying thereon the image forming elements.

These and other objects, features and advantages of the present invention will become more apparent upon a consideration of the following description of the preferred embodiments of the present invention taken in conjunction with the accompanying drawings.

DETAILED DESCRIPTION OF THE INVENTION

In the present invention, in order to form a layer of a binder on a substrate, the binder may be applied by means of a blade or an applicator, or may be sprayed on the substrate. Further, the binder layer may be disposed on a substrate by using a gravure printing method.

Further, in order to dispose the image forming elements on the binder, there may be used a method wherein image forming elements are simply distributed or sprinkled thereon, or a method wherein image forming elements are mixed with a gas stream and are sprayed on the binder layer. In the present invention, after the image forming elements are disposed on the binder, vibration and pressure are applied to the image forming elements, whereby a larger number of image forming elements may be bonded to the binder.

Hereinbelow, there is described an embodiment of the production process according to the present invention.

Figure 1:
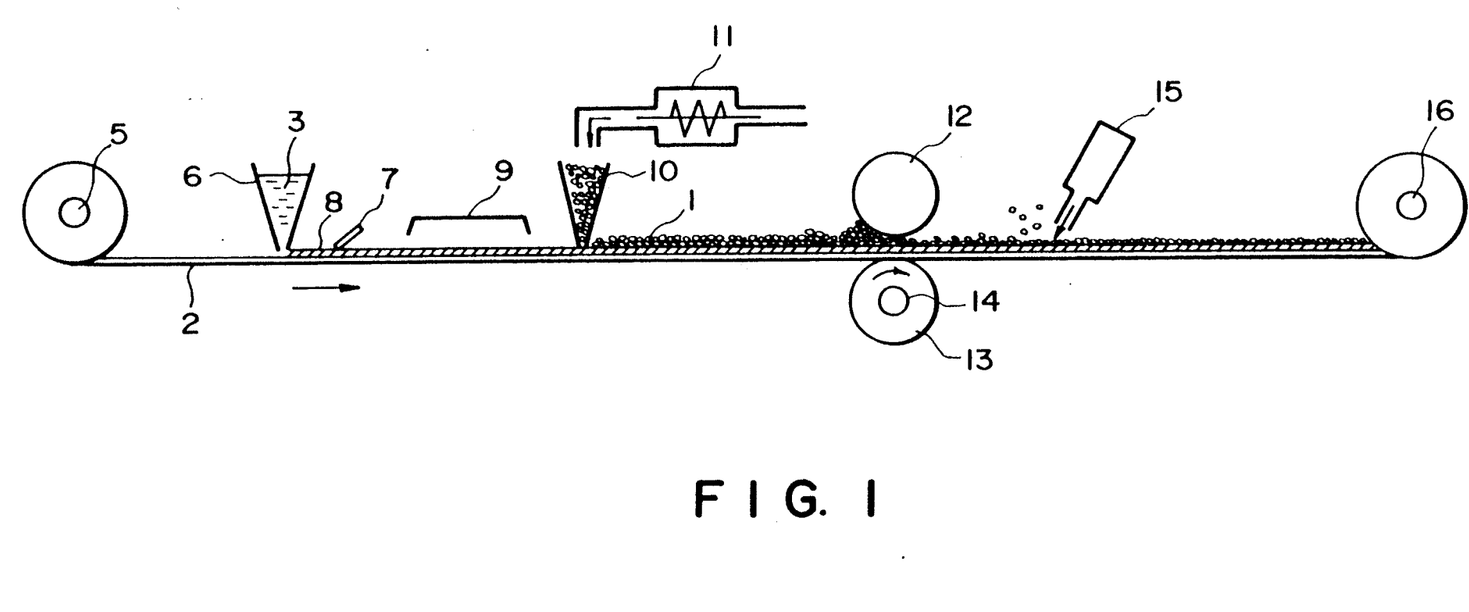
FIG. 1 is a schematic side view showing an embodiment of the apparatus for suitably practicing the production process according to the present invention.

Referring to FIG. 1, a substrate roller 5 feeds a substrate 2 in a predetermined direction as shown by an arrow. In this embodiment, in order to conduct respective steps while successively moving the substrate 2 per se, a continuous sheet-like material is used as the substrate 2. However, a substrate which has been cut into a predetermined size can also be used, when the respective steps are conducted intermittently. The substrate 2 may for example be a film of a polymer such as PET (polyethylene terephthalate), polyamide and polyimide, or paper such as capacitor paper.

In this embodiment, a binder is first applied onto a substrate 2 in a binder application step. In FIG. 1, reference numeral 6 denotes a container for binder application which is capable of holding a binder 3 and applying the binder 3 onto the substrate 2. The binder 3 is successively applied onto the substrate 2 by means of the binder application container 6. The surface of the binder 3 applied onto the substrate is then smoothened by means of a blade 7, whereby the binder 3 applied onto the substrate 2 is converted into a binder layer 8 having a desired thickness.

The binder 3 may for example be an adhesive such as epoxy adhesive, polyvinyl alcohol, polyvinyl pyrrolidone, polyacrylamide, urethane adhesive, acrylic adhesive, polyester adhesive, and ethylene-vinyl acetate copolymer.

In order to form the binder layer 8 on the substrate 2, there may also be used a method wherein the binder 3 is sprayed on the substrate 2, a method using gravure printing, etc.

In FIG. 1, the above-mentioned binder layer 8 is dried under heating by means of a drier 9. The solvent contained in the binder layer 8 is evaporated to some extent by means of the drier 9.

Next, in an element-supplying step, image forming elements are supplied onto the binder layer 8 as shown in FIG. 1. Reference numeral 10 denotes a feeder for holding the image forming elements 1 and supplying them onto the binder layer 8 little by little (or gradually). To the feeder 10, the image forming elements 1 are supplied from a mixer 11. The mixer 11 uniformly mixes the image forming elements 1. In the element-supplying step, the image forming elements are simply put on the binder layer 8, and the image forming elements 1 disposed on the binder layer 8 assume a multi-layer (or multi-particle layer) form, whereby the image forming elements are not sufficiently bonded to the binder. In the next vibrating and pressing step, the image forming elements 1 are caused to closely adhere to the binder so as to provide a substantially mono-particle layer.

In the vibrating and pressing step, the image forming elements 1 which have been disposed on the binder layer 8 so as to provide a multi-particle layer are pressed by means of a roller 12 and are simultaneously supplied with vibration in a direction (i.e., in the direction of an arrow f shown in FIG. 2) which is substantially perpendicular to the moving direction of the substrate 2, in substantially the same plane as the surface of the substrate 2. The above-mentioned pressing operation is conducted by means of the roller 12 in combination with a pressing roller 13 which is disposed opposite to the above-mentioned roller 12 by the medium of the substrate 2.

The rollers 12 and 13 are disposed so that they traverse or intersect the substrate 2 and the roller 12 vibrates in the longitudinal direction (i.e., in the direction of the rotation axis) of the roller 12. At one end of the roller 12, a vibration unit 21 is disposed a shown in FIG. 2.

Figure 2:
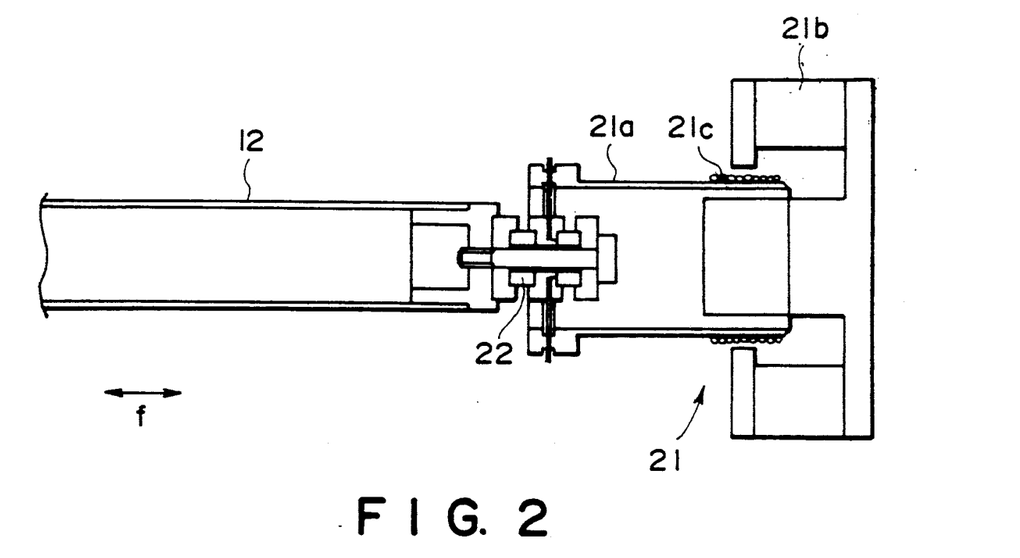
FIG. 2 is a schematic sectional view showing a unit for imparting pressure and vibration to image forming elements.

Referring to FIG. 2, the vibration unit 21 comprises movable part 21a and a magnetic circuit 21b. At one end of the movable part 21a, a coil 21c is wound, and to the other end thereof, the end of the roller 12 is connected. The roller 12 is rotatably connected to the movable part 21a by the medium of a bearing 22. A force based on the magnetic lines of force exerted by the magnetic circuit 21b is applied to the coil 21c, and the coil 21c causes the movable part 21a and the roller 12 to vibrate in the longitudinal direction of the roller 12. The roller 12 may preferably be vibrated at a frequency of 50–300 Hz (more preferably 80–120 Hz) at an amplitude of 0.1–1 mm (more preferably 0.2–0.5 mm).

Each of the rollers 12 and 13 may for example be one comprising a roller of a metal such as aluminum covered with an elastic or elastomeric material such as silicone rubber. The roller 12 may more preferably be one obtained by further coating such a roller with a teflon resin. The rollers 12 and 13 may preferably have a diameter of about 10–50 mm.

The vibration to be applied to the image forming element 1 by means of the roller 12 may be applied not only in the direction perpendicular to but in the same direction as the moving direction of the substrate 2, in the same plane as the surface of the substrate 2. However, as the direction of the vibration becomes nearer to the moving direction of the substrate 2, the effect of arranging the image forming elements precisely and/or densely so as to provide a mono-particle layer is lessened. In the present invention, the direction of the vibration may preferably be in the range of ±45 degrees, more preferably ±20 degrees counted from the direction perpendicular to the moving direction of the substrate 2, in the same plane as the surface of the substrate 2.

The clearance between the roller 12 and the substrate 2 may preferably be 10-30 microns in a case where image forming elements having an average particle size of about 10 microns are used, while it can be changed depending on the particle size of the image forming elements used and the thickness of the binder layer.

Further, in some cases, it is possible to fix the roller 12 so as not to rotate, and to apply vibration and pressure to the image forming elements 1 by using such a roller 12.

The roller 13 may contain a heater (not shown) in the inside thereof, as desired. When such a heater is caused to generate heat, the binder layer 8 is softened, whereby the image forming element 1 may easily adhere to the binder layer 8 more closely. In such a case, the surface temperature of the roller 13 may preferably be about 60-90° C. Further, the roller 13 my be connected to a motor (not shown) as desired, so that the substrate 2 may be moved by the rotation of the roller 13.

Figure 3:
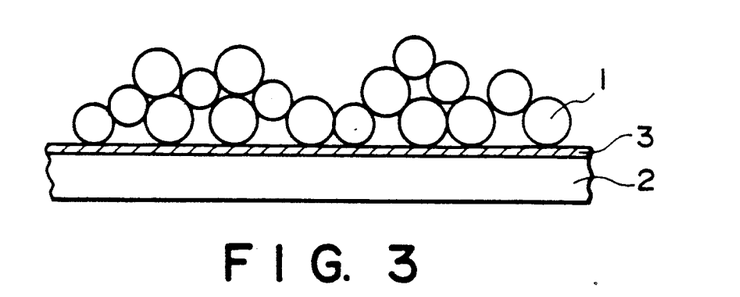
FIG. 3 is a schematic side view showing a state wherein image forming elements are distributed on a binder layer.
Figure 4:
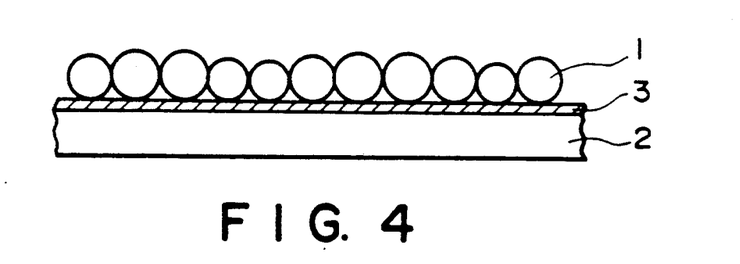
FIGS. 4 and 5 are schematic side views each showing a state wherein image forming elements disposed on a substrate have been supplied with pressure and vibration.

When the substrate 2 carrying the image forming elements 1 is passed through the vibrating and pressing step in the above-mentioned manner, the image forming elements forming a multi-particle layer as shown in FIG. 3 is converted into a mono-particle layer form as shown in FIG. 4, and they assume a densely packed state with smaller interstices between the elements.

Figure 6:
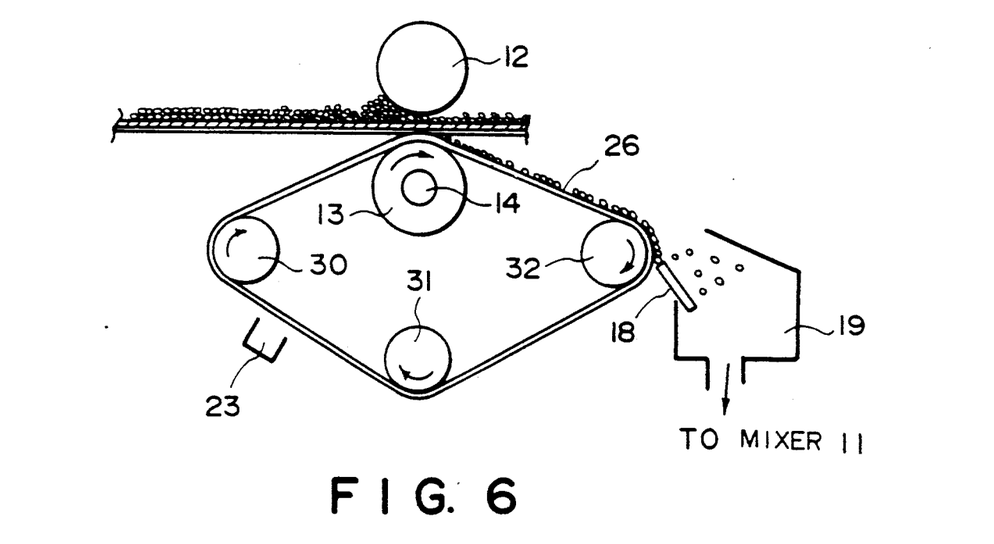
FIG. 6 is a schematic side view showing another embodiment of the unit for imparting pressure and vibration to image forming elements.
Figure 7:
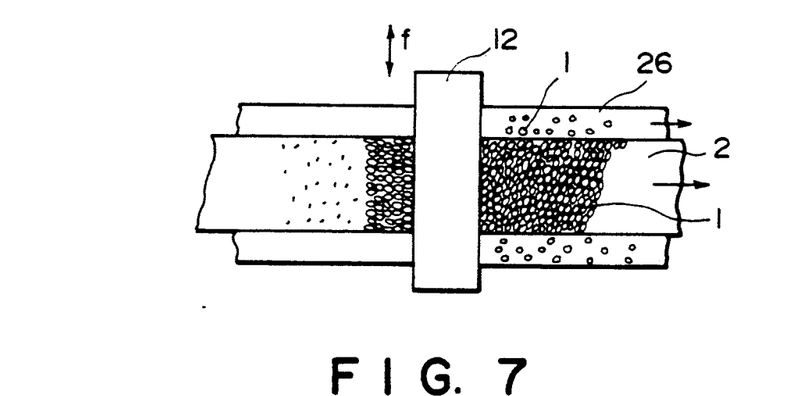
FIG. 7 is a schematic plan view showing the unit shown in FIG. 6.

As shown in FIG. 6, the image forming elements 1 dropped from both sides of the substrate 2 due to the vibration of the roller 12 may be received and collected by an endless belt 26, whereby such image forming elements 1 ma be reused. As shown in the plan view of FIG. 7, the endless belt 26 has a width larger than that of the substrate 2 so that the belt 26 may receive the image forming elements 1 dropped from the substrate 2. Referring to FIG. 6, the belt 26 is moved by means of conveying rollers 30, 31 and 32, and the image forming elements 1 disposed on the belt 26 are collected by means of a blade 18 and a container 19 and then reused. The container 19 may be one capable of sucking the image forming elements 1.

The belt 26 may preferably comprise a material such as plastic and rubber, because such a material is readily available. The belt 26 may be any one unless the image forming elements 1 adhere to it and are hard to be collected. Instead of the endless belt 26, a film comprising polyethylene, polyimide, etc., can be used in a non-endless form.

In FIG. 6, the belt 26 is moved in the same direction as the moving direction of the substrate 2, but it is possible that the belt 26 is disposed with a certain clearance with the substrate 2 and the belt 26 is moved in the counter direction to the moving direction of the substrate 2.

When the belt 26 is prepared by using a dielectric substance, and it is kept at a high potential state, the image forming elements 1 may be attached to the belt 26 on the basis of an electrostatic force, whereby the image forming elements may be collected in a higher efficiency.

Figure 5:
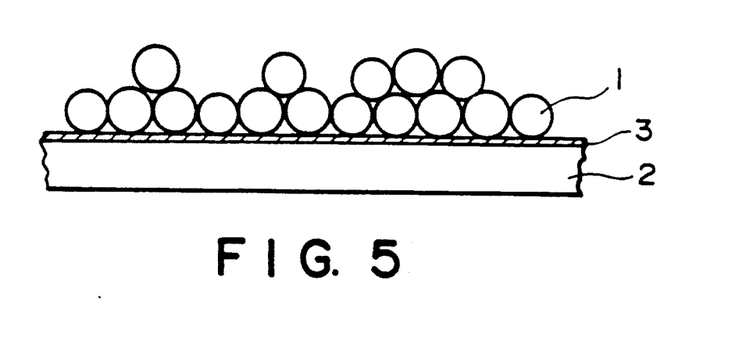
Figure 8:
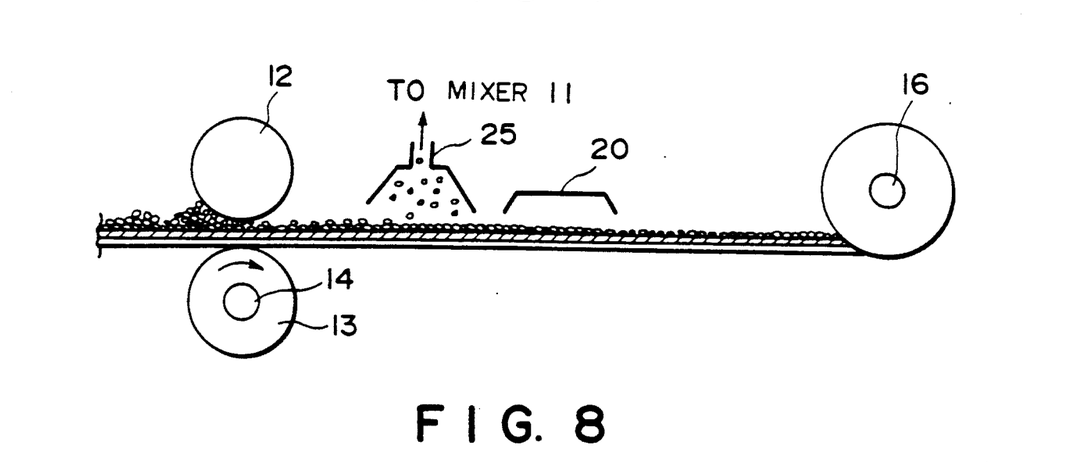
FIG. 8 is a schematic side view showing another embodiment of the portion of from a vibration and pressing means to a wind-up roller.

Even after the substrate 2 passes through the vibrating and pressing step, a part of the image forming elements 1 do not contact the binder layer in some cases as shown in FIG. 5 because those constituting the first particle layer have substantially no interstice. In such a case, a gas stream ejection means 15 may be disposed as desired, as shown in FIG. 1, so that image forming elements 1 not sufficiently contacting the binder layer 8 are removed by blowing them off. Alternatively, image forming elements 1 not sufficiently contacting the binder layer 8 may be removed by sucking them by a sucking device 25, as shown in FIG. 8. The thus removed image forming elements 1 may be fed to the mixer 11 to be reused.

Through the above-mentioned steps, there is produced a recording medium comprising the substrate 2 and plural image forming elements 1 disposed thereon wherein the image forming elements 1 are densely disposed in a substantially mono-particle layer, and finally the recording medium is wound about a wind-up roller 16. As shown in FIG. 8, the binder 3 may be hardened by means of a drying oven 20 as desired, before the recording medium is wound about the wind-up roller 16.

Figure 9:
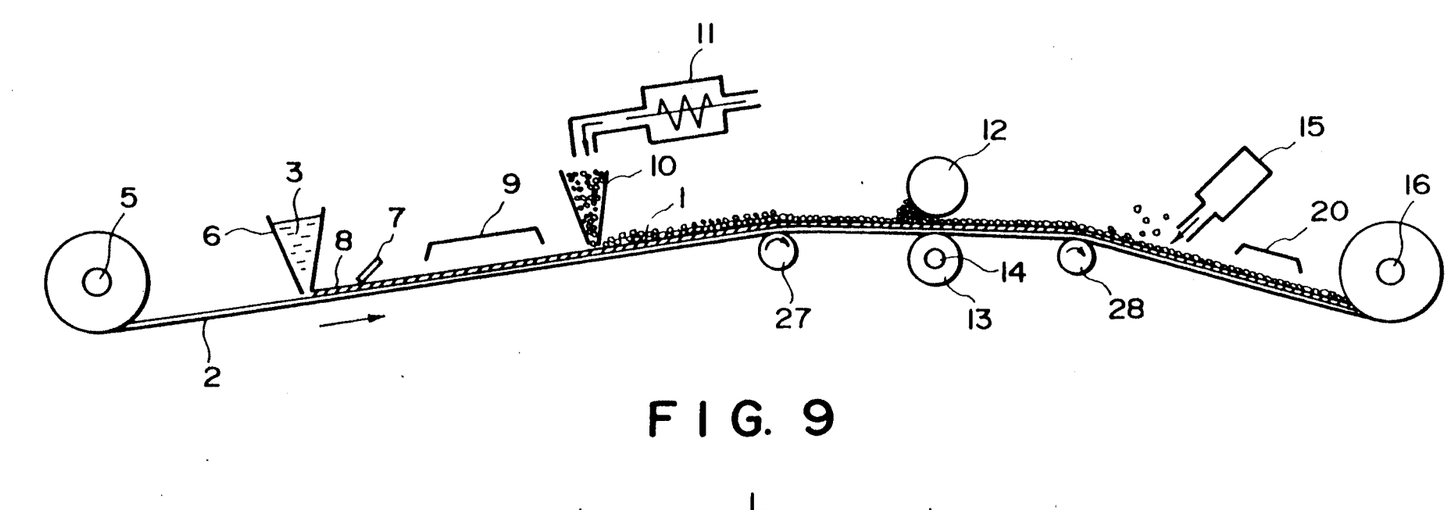
FIGS. 9, 11 and 12 are schematic side views each showing another embodiment of the production apparatus according to the present invention.
Figure 10:
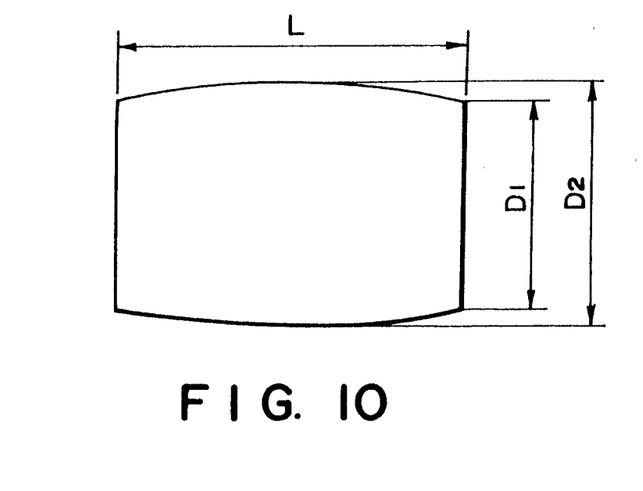
FIG. 10 is a schematic side view showing an embodiment of the cambered roller used in the apparatus shown in FIG. 9.

In the present invention, the recording medium may be produced in the above-mentioned manner. Further, in order to prevent the substrate 2 from wrinkling during the conveyance thereof, the substrate 2 may be moved so that it is passed over the peripheral surface of a cambered roller 27, as shown in FIG. 9. Referring to FIG. 10, the cambered roller 27 may preferably be one comprising a body of revolution having a generatrix of curved line, wherein the diameter $D_2$ of the central portion (i.e., maximum diameter) is larger than the diameter $D_1$ of the upper and bottom surfaces. Another cambered roller 28 as shown in FIG. 9 may also be the same as described above. At least one of the cambered roller 27 and 28 may preferably be one satisfying the following relationship.

$$0.002 \leq (D_2 - D_1)/L \leq 0.01,$$

wherein L denotes the length of the cambered roller.

In a case where such a cambered roller 27 is used, even when the substrate 2 is somewhat wrinkled before it passes over the cambered roller 27, the wrinkles are moved outside of the substrate 2 under the action of a force acting toward the outside of the roller 27 along the axis direction thereof (i.e., a component of a tension) when the substrate 2 passes through the cambered roller 27, whereby the wrinkles are removed. The cambered roller 28 may also function in the same manner as described above. At the positions of the cambered rollers 27 and 28, the tension applied to the substrate 2 in the moving direction thereof may preferably be 50-200 g/cm.

Figure 11:
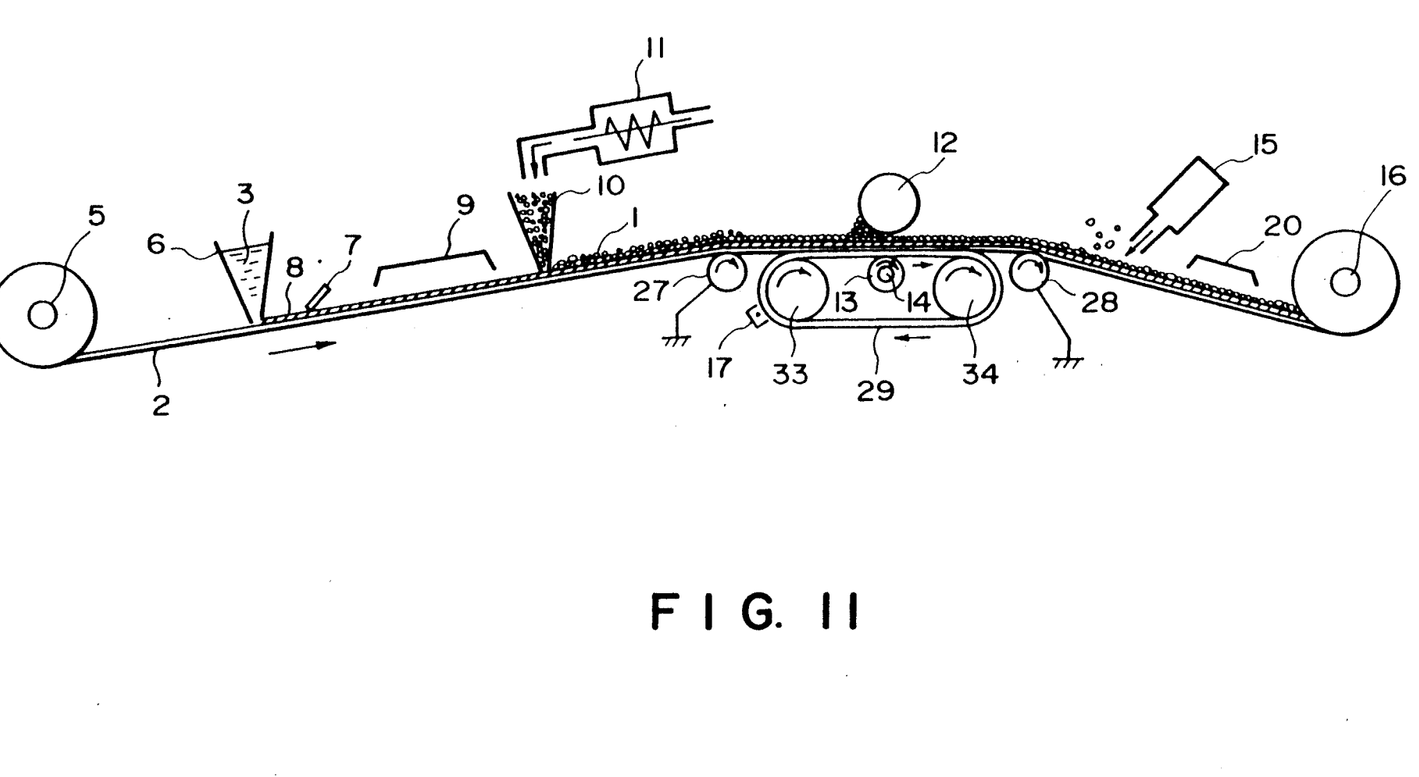

In a further preferred embodiment, an electrostatic adhesion belt 29 is used in combination with the cambered rollers 27 and 28 as shown in FIG. 11, in order to prevent the substrate 2 from wrinkling. More specifically, it is preferred that the electrostatic adhesion belt 29 is disposed between the cambered rollers 27 and 28 and opposite to the vibrating roller 12, so that the substrate 2 is conveyed while it is caused to adhere to the belt 29 due to an electrostatic force, whereby the occurrence of a wrinkle is prevented. As shown in FIG. 11, the belt 29 may be moved by means of rollers 33 and 34.

It is preferred that the electrostatic adhesion belt 29 is charged by means of a corona charger 17 so that it is kept at a high potential (e.g., at a surface potential of 1.5 KV), while the cambered rollers 27 and 28 are connected to the ground. The electrostatic adhesion belt 29 may for example be one comprising a 60 micron-thick PET film and a 240 micron-thick coating layer disposed thereon which comprises polyester and carbon powder dispersed therein. In FIG. 11, the belt 29 is used so that the PET surface is disposed outside. It is preferred that a heater 14 is disposed inside of the roller 13 so that the binder layer may be heated.

The image forming element 1 may comprise a microcapsule as shown in FIG. 16, but may also be a particulate without a wall material 1b which is obtained by simply solidifying a colorant and another optional material.

The particulate image forming element 1 without a wall material 1b may be obtained by melt-mixing predetermined components and spray-dying the resultant mixture.

Microcapsuler image forming element 1 may be produced in any of the known methods, such as simple coacervation interfacial polymerization, in-situ polymerization, interfacial precipitation, phase separation, spray drying, gaseous-phase suspension coating, and mechano-chemical process.

As the material constituting the particulate image forming element 1 or the core material 1a of the capsular image forming element 1, various materials can be used depending on an recording method to be used therefor. For example, the above-mentioned materials as described in U.S. Pat. Nos. 4,399,209 and 4,416,766 can be used as such. Further, in a recording method wherein the material constituting an image forming element causes a abrupt reaction under the application of heat and light energies, and the image forming element 1 decreases its transferability to a transfer-receiving medium, thereby to form a recorded image (e.g., in the recording method as described in the above-mentioned U.S. patent application No. 869,689 of our research group), the image forming element 1 may comprise a functional or sensitive component, a colorant and an optional additive. In the case of a capsular image forming element, the core material 1a thereof may comprise these materials. The "functional component" used herein is a component which is capable of causing curing or hardening under the application of heat and light energies, and is capable of decreasing the transferability of the image forming element 1 to a transfer-receiving medium.

The wall material 1b of the microcapsules may for example be formed of a material including gelatin, gum arabic; cellulosic resins such as ethyl cellulose and nitrocellulose; polymers such as urea-formaldehyde resin, polyamides, polyesters, polyurethane, polycarbonate, maleic anhydride copolymers, polyvinylidene chloride, polyvinyl chloride, polyethylene, polystyrene and polyethylene terephthalate (PET).

Hereinbelow, the present invention will be described in more detail by way of examples.

Example 1

TABLE 1

| Item | Component | wt. % |
|---|---|---|
| Polymerizable monomer | $CH_2{=}CH{-}\underset{O}{\underset{\|}{C}}{-}O{-}CH_2{-}CH_2{-}O{-}\underset{O}{\underset{\|}{C}}{-}NH{-}CH_2{-}\langle H \rangle{-}CH_2{-}HN{-}\underset{O}{\underset{\|}{C}}{-}O{-}CH_2{-}CH_2{-}O{-}\underset{O}{\underset{\|}{C}}{-}CH{=}CH_2$ | 63 |
| Photopolymerization initiator | 4,4'-Dimethoxybenzil/Ethyl p-dimethylaminobenzoate | 5.1/0.4 |
| Binder | Polymethyl methacrylate (Elvasite 2041, mfd. by Du Pont) | 22.5 |
| Colorant | PV Fast Pink E-01 (mfd. by Hoechst) | 9 |

TABLE 2

| Item | Component | wt. % |
|---|---|---|
| Polymerizable monomer | $CH_2{=}CH{-}\underset{O}{\underset{\|}{C}}{-}O{-}CH_2{-}CH_2{-}O{-}\underset{O}{\underset{\|}{C}}{-}NH{-}CH_2{-}\langle H \rangle{-}CH_2{-}HN{-}\underset{O}{\underset{\|}{C}}{-}O{-}CH_2{-}CH_2{-}O{-}\underset{O}{\underset{\|}{C}}{-}CH{=}CH_2$ | 62 |
| Photopolymerization initiator | 2-Chlorothioxanthone/Ethyl p-dimethylaminobenzoate | 4.8/1.2 |
| Binder | Polymethyl methacrylate (Elvasite 2041, mfd. by Du Pont) | 22 |
| Colorant | Cyanine Blue 3472 (mfd. by Dainichi Seika K.K.) | 10 |

Image forming elements in a microcapsular form were prepared by using the components shown in the above Tables 1 and 2 in the following manner.

10 g of a mixture of components (core material) shown in Table 1 was mixed with 20 g of methylene chloride. The resultant mixture was further mixed with a solution obtained by dissolving a few drops of nonionic surfactant (Nonipole 100, HLB=13, mfd. by Sanyor Kasei Kogyo K.K.) and 1 g of gelatin in 200 ml of water, and the mixture was further emulsified by means of a homomixer at 8000–10000 rpm, on heating at 60° C., thereby to obtain oil droplets having an average particle size of 26 microns. The mixture was further stirred for 30 min. at 60° C., and then the methylene chloride was distilled off thereby to obtain oil droplets having an average particle size of 10 microns.

Then, a solution obtained by dissolving 1 g of gum arabic in 20 ml of water was added to the above prepared mixture. An NH$_4$OH (aqueous ammonia solution) was added to the resultant mixture, while cooled slowly to room temperature (25° C.) to adjust the pH to 11 or higher, whereby a microcapsule slurry was prepared. Thereafter, 1.0 ml of a 20% aqueous glutaraldehyde solution was slowly added to the slurry at room temperature (25° C.) thereby to harden the microcapsule walls.

The slurry was subjected to solid-liquid separation by means of a Nutsche funnel, and the solid was dried at 35° C. for 10 hours in a vacuum drier to obtain microcapsular image forming elements.

The above procedure was repeated except that 10 g of a mixture of core material components shown in Table 2 was used instead of those shown in Table 1.

The thus obtained two species of the image forming elements were microcapsules which comprised each of the core materials shown in Tables 1 and 2, and a wall material coating the core material and had particle size of about 7-15 microns, and a number-average particle size of 10 microns.

The thus prepared two species of image forming elements (mixing wt. ratio=1:1) were charged in a mixer as shown in FIG. 1, and a recording medium was prepared by using an apparatus as shown in FIG. 1.

More specifically, a substrate 2 comprising a 6 micron-thick PET film was used, and was moved at a speed of 5 mm/s. Further, there was used a binder 3 comprising a solution which comprised 1 cc of a polyester-type adhesive (Polyester LP-022, mfd. by Nihon Gosei Kogyo K.K., solid content =50%) and 3 cc of toluene. The thickness of the binder layer 8 formed by coating was about 1 micron after drying.

Referring to FIG. 1, the above-mentioned two species of image forming elements were sufficiently mixed and supplied onto the binder layer 8 by means of a feeder 10 at a feed rate of 0.06 g/sec. Thereafter, a pressure of 0.1 kg/cm was applied to the image forming elements 1 disposed on the substrate 2 by means of rollers 12 and 13, and simultaneously, a vibration having a frequency of 100 Hz and an amplitude of 300 microns was applied thereto by means of the roller 12 in the longitudinal direction of the roller 12. The roller 12 used herein was disposed in a direction perpendicular to the moving direction of the substrate 2. The clearance between the roller 12 and the substrate 2 was about 30 microns, and the surface temperature of the roller 13 was kept at about 80° C. by means of a heater 14 contained therein.

The roller 12 used herein comprised one obtained by covering an aluminum roller (diameter=18 mm, length=10 mm) with an about 1 mm-thick silicone rubber layer (rubber hardness=70 degrees), and further covering the silicone rubber layer with an about 25 microns-thick coating of a teflon resin. The roller 13 used herein comprised one obtained by covering an aluminum roller the same as described above with an about 1 mm-thick silicone rubber layer (rubber hardness=70 degrees).

After the substrate passed through the vibrating and pressing step as described above, image forming elements which had not sufficiently been bonded to the binder layer 8 were blown off by using an air stream (0.05 kg/cm$^2$) supplied from a gas ejection means 15 to be removed, whereby a recording medium was prepared. The thus prepared recording medium was wound about a wind-up roller 16.

With respect to the above-mentioned recording medium, the coating proportion of microcapsules was measured. The "coating proportion" used herein was evaluated in terms of the proportion of the projection area of the microcapsules per unit area of the substrate surface. As a result, the coating proportion was found to be 80% in this instance.

Transfer Experiment

By using the recording medium obtained above, a transfer experiment was conducted in the following manner.

Figure 13:
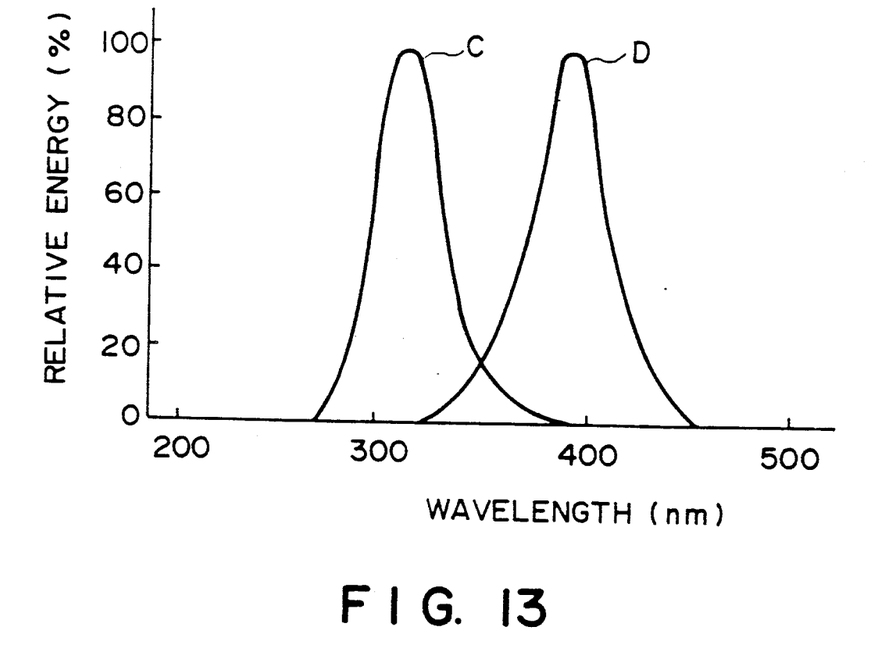
FIG. 13 is a graph showing a spectral characteristic of a fluorescent lamp used in a transfer experiment on a recording medium produced according to the production process of the present invention.

Thus, the PET surface of the recording medium was caused to closely contact a hot plate heated up to 120° C., and desired portions of the image forming elements were respectively illuminated for about 50 msec with a 20 W-health ray fluorescent lamp (FL 20SE, mfd. by Toshiba K.K.) having a spectral characteristic shown by the graph C of FIG. 13, and a 20 W-fluorescent lamp (FL 10A 70 E390, mfd. by Toshiba K.K.) having a spectral characteristic shown by the graph D of FIG. 13. These lamps were disposed at a distance of about 25 mm from the image forming elements.

Thereafter, the recording medium was superposed on a transfer-receiving paper (a medium to be transfer-printed) having a surface smoothness of about 10-20 sec (Bekk smoothness) so that the image forming element side of the recording medium contacted the paper, and the resultant laminate was passed through rollers mutually contacting under pressure. Herein, the pressure applied between the two rollers was set to about 25 kg/m$^2$, and the surface of the roller contacting the recording medium had been heated up to 90-100° C. in advance.

When the recording medium was peeled from the transfer-receiving paper after the passage through the rollers, high-quality recorded image showing blue and magenta colors were provided on the transfer-receiving paper.

Example 2

Figure 12:
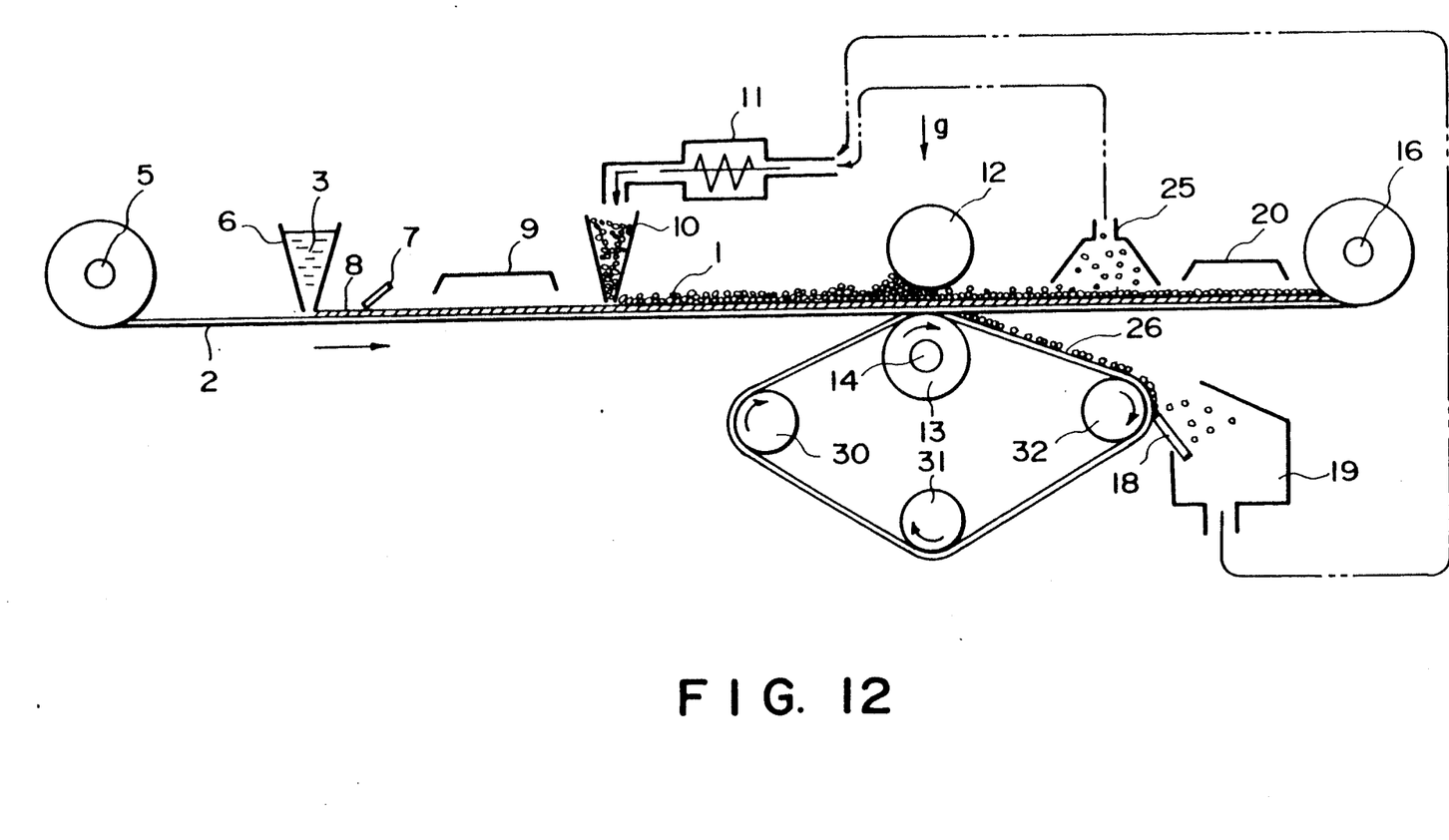

A recording medium was prepared in the same manner as in Example 1 except that a belt 26 as shown in FIG. 6 was disposed at the position of the roller 13 (FIG. 1) as shown in FIG. 12, and a suction device 25 and a drying oven 20 were disposed as shown in FIG. 8.

The belt 26 used herein comprised 1 mm-thick silicone rubber belt. The belt 26 had a width which was 40 mm larger than that of the substrate 2, and was disposed so that 20 mm-wide portions of the belt 26 on both sides did not contact the substrate 2. In this instance, microcapsules collected by the suction device 25 and a container 19 as shown in FIG. 12 were fed to the mixer 11 by means of a powder pump (not shown) and were reused.

When the thus prepared recording medium was subjected to a transfer experiment in the same manner as in Example 1, high-quality recorded images showing blue and magenta colors were provided on the transfer-receiving paper.

Example 3

A recording medium was prepared in the same manner as in Example 1 except that an electrostatic adhesion belt 29, a corona charger 17 and cambered rollers 27 and 28 were disposed at the position of the roller 13 (FIG. 1) as shown in FIG. 11, and a drying oven 20 was disposed downstream of the gas stream ejection means 15 as shown in FIG. 11.

The electrostatic adhesion belt 29 comprised a 60 micron-thick PET film and a 240 micron-thick polyester coating layer containing carbon powder dispersed therein. The tension applied to the substrate 2 at the positions of the cambered rollers 27 and 28 was 0.5 kg with respect to the moving direction of the substrate 2. The belt 29 was charged by means of the corona charger 17 so as to provide a surface potential of 1.5 KV.

When the thus prepared recording medium was subjected to a transfer experiment in the same manner as in Example 1, high-quality recorded images showing blue and magenta colors were provided on the transfer-receiving paper.

Comparative Example 1

A recording medium was prepared in the same manner as in Example 1 except that the vibration in the arrow f direction as shown in FIG. 2 was not applied to the roller 12.

With respect to the thus prepared recording medium, the coating proportion was evaluated in the same manner as in Example 1. As a result, the coating proportion was 65%.

As described hereinabove, according to the production process of the present invention, image forming elements not sufficiently contacting a binder, among those supplied onto a substrate, may be pushed into the interstices between image forming elements contacting the binder. As a result, according to the present invention, there is provided a recording medium wherein image forming elements are very closely disposed on a substrate so as to form a substantially mono-particle layer.

What is claimed is:

1. A process for producing a recording medium comprising a substrate and a plurality of image forming elements disposed thereon, which comprises the steps of:
    applying a binder onto the substrate to form thereon a binder layer;
    disposing the image forming elements on the binder layer; and
    simultaneously applying a vibration and a pressure in a direction toward the substrate to the image forming elements disposed on the binder layer sufficient to bond the image forming elements to the substrate as a substantially monoparticle layer.

2. A process according to claim 1, wherein said vibration is applied to the image forming elements in the width direction of the substrate.

3. A process according to claim 1, wherein said substrate is moving and vibration is applied to the image forming elements in such a direction that it forms an angle of ±45 degrees or smaller with the direction perpendicular to the moving direction of the substrate, in the same plane as the substrate.

4. A process according to claim 1, wherein said substrate is moving and vibration is applied to the image forming elements in such a direction that it forms an angle of ±20 degrees or smaller with the direction perpendicular to the moving direction of the substrate, in the same plane as the substrate.

5. A process according to claim 1, wherein said binder is heated simultaneously with the application of the vibration and pressure.

6. A process according to claim 1, which further comprises a step of collecting the image forming elements dropped from the substrate due to the vibration.

7. A process according to claim 6, wherein the image forming elements dropped from the substrate are collected by receiving them by use of a belt.

8. A process according to claim 7, wherein said belt comprises a dielectric material, and is charged so that the image forming elements are collected by utilizing an electrostatic force.

9. A process according to claim 1, wherein the image forming elements not sufficiently contacting the binder are removed by blowing them off the substrate, after the vibration and pressure are applied to the image forming elements disposed on the substrate.

10. A process according to claim 1, wherein the image forming elements not sufficiently contacting the binder are removed by sucking them from the substrate, after the vibration and pressure are applied to the image forming elements disposed on the substrate.

11. A process according to claim 1, wherein the substrate is conveyed during the process and is passed over the peripheral surface of a cambered roller which is employed to inhibit wrinkling of the substrate during the conveyance thereof.

12. A process according to claim 11, wherein the substrate is conveyed while being attached to an electrostatic adhesion belt after it is passed over the peripheral surface of the cambered roller.

* * * * *

UNITED STATES PATENT AND TRADEMARK OFFICE
CERTIFICATE OF CORRECTION

PATENT NO. : 5,068,123
DATED : November 26, 1991
INVENTOR(S) : HIROSHI GOTO, ET AL.

It is certified that error appears in the above-identified patent and that said Letters Patent is hereby corrected as shown below:

COLUMN 3

Line 52, "a" should be deleted.
Line 56, "an" should read --a--.

COLUMN 7

Line 40, "ma" should read --may--.

COLUMN 9

Line 22, "Microcapsuler" should read --Microcapsular--.
Line 65, "a" should read --an--.

COLUMN 10

Line 64, "Sanyor" should read --Sanyo--.

COLUMN 12

Line 40, "image" should read --images--.

Signed and Sealed this

First Day of June, 1993

Attest:

MICHAEL K. KIRK

Attesting Officer

Acting Commissioner of Patents and Trademarks